United States Patent [19]
Pond et al.

[11] Patent Number: 4,792,779
[45] Date of Patent: Dec. 20, 1988

[54] TRIMMING PASSIVE COMPONENTS BURIED IN MULTILAYER STRUCTURES

[75] Inventors: Ramona G. Pond, Downey; William A. Vitriol, Anaheim; Raymond L. Brown, Riverside, all of Calif.

[73] Assignee: Hughes Aircraft Company, Los Angeles, Calif.

[21] Appl. No.: 183,521

[22] Filed: Apr. 18, 1988

Related U.S. Application Data

[63] Continuation of Ser. No. 910,109, Sep. 19, 1986, abandoned.

[51] Int. Cl.$^4$ .............................................. H01C 10/00
[52] U.S. Cl. ............................. 338/195; 219/121 LJ; 338/314; 338/309
[58] Field of Search ............... 338/195, 308, 309, 314; 219/121 LH, 121 LJ, 121 LG, 121 LN

[56] References Cited

U.S. PATENT DOCUMENTS

| | | | |
|---|---|---|---|
| 3,649,801 | 3/1972 | Cardell et al. | 338/195 X |
| 3,669,733 | 12/1969 | Allington | 338/195 |
| 3,726,733 | 2/1971 | Kamura et al. | 338/195 X |
| 3,996,551 | 12/1976 | Croson | 338/195 X |
| 4,019,168 | 4/1977 | Collins | 338/195 X |
| 4,288,776 | 9/1981 | Holmes | 338/195 X |
| 4,622,856 | 11/1986 | Binder | 338/195 X |

FOREIGN PATENT DOCUMENTS 0108314 5/1984 European Pat. Off. .

OTHER PUBLICATIONS

Solid State Technology, vol. 29, No. 1, Jan. 1986, J. I. Steinberg et al., "Low Temperature Co-Fired Tape Dielectric Material Systems For Multilayer Interconnections", pp. 97-101.

*Primary Examiner*—C. L. Albritton
*Attorney, Agent, or Firm*—Kenneth W. Float; A. W. Karambelas

[57] ABSTRACT

A technique is disclosed for trimming resistors and other passive circuit components buried in hybrid multilayer circuit structures. For example, resistors (13) are formed between two dielectric layers (11, 19) of a hybrid multilayer circuit structure (10). The multilayer circuit structure with the buried resistors is appropriately processed to provide a fired multilayer circuit structure. Trimming of the buried resistors is accomplished with a laser beam that cuts through dielectric material of the fired circuit structure to selectively remove part of the resistive material of the buried resistors. The values of the buried resistors may be tested with conductive elements (15, 17) that are conductively coupled to the buried resistors. The disclosed technique also contemplates the trimming of other buried passive circuit components such as capacitors, and further contemplates the use of other trimming methods such as abrasive, air jet, or water jet trimming.

11 Claims, 1 Drawing Sheet

TRIMMING PASSIVE COMPONENTS BURIED IN MULTILAYER STRUCTURES

CROSS-REFERENCE TO RELATED APPLICATIONS

This application is a continuation of application Ser. No. 06/910,109, filed Sept. 19, 1986, abandoned.

BACKGROUND OF THE INVENTION

The disclosed invention generally relates to the precision trimming of passive components in hybrid multilayer circuit structures, and more particularly is directed to a technique for trimming resistors, capacitors and other passive components buried in hybrid multilayer circuit structures.

Hybrid multilayer circuit structures, also known as hybrid microcircuits, implement the interconnection and packaging of discrete circuit devices, and generally include a plurality of dielectric layers respectively having predetermined conductor traces and conductive vias. Generally, the discrete circuit devices are mounted on the top dielectric layer.

Known techniques for fabricating multilayer circuit structures include thick film technology and dielectric tape technology. With thick film technology, each dielectric layer is individually deposited in paste form and then fired. With dielectric tape technology, each dielectric layer is made of dielectric tape. The layers may be sequentially applied and fired (referred to as the tape transfer process), or the entire laminate of layers may be fired at one time (referred to as the cofired process).

The use of precision resistors and/or capacitors with hybrid multilayer circuit structures has generally been a compromise between area available for circuit elements and discrete circuit device packing density. For example, precision resistors have been utilized in the form of either trimmable thick film resistors printed on the top dielectric layer (surface resistors) or discrete chip resistors which are mounted on the top dielectric layer along with the discrete circuit devices. Similarly, trimmable capacitors may be printed on the top dielectric layer (surface capacitors). Such use of the top dielectric layer for resistors or capacitors reduces the area that would otherwise be available for discrete circuit devices.

In search of higher packing densities, efforts have been made to include passive circuit components, such as resistors and capacitors, in the processing of multilayer circuit structures. Such components may be buried in the hybrid multilayer circuits, or they may be formed on the top dielectric layer.

However, the values of buried resistors and capacitors made pursuant to known techniques are difficult to precisely control, and therefore are unsuitable where precision resistors or capacitors are required. Moreover, buried resistors and capacitors have not been trimmable since they are buried. Surface resistors and capacitors formed on the top dielectric layer are amenable to laser trimming and are utilized as precision resistors and capacitors. Such surface resistors and capacitors are covered with a glass passivation layer, and trimming is achieved with laser equipment which cuts through the glass layer to selectively remove resistive material or capacitor plate material.

An important consideration with utilizing surface resistors and capacitors is the reduced device packing density that results from allocating area on the top dielectric layer to such passive circuit components. A further consideration with utilizing surface resistors and capacitors is the necessity of extra processing steps to provide a glass passivation layer.

SUMMARY OF THE INVENTION

It would therefore be an advantage to provide a technique for trimming passive components that are formed betweeen dielectric layers of a hybrid multilayer circuit structure.

It would also be an advantage to provide for trimmable passive circuit components in a hybrid multilayer circuit structure which do not require glass passivation layers.

Another advantage would be to provide for trimmable passive components that may be buried in a hybrid multilayer circuit structure.

The foregoing and other advantages and features are provided by the method of the invention which includes the steps of (a) forming a passive circuit component between two dielectric layers of a hybrid multilayer circuit structure, (b) processing the multilayer circuit structure to provide a fired multilayer circuit structure, and (c) selectively removing part of the material of the passive circuit component to trim the passive circuit component.

BRIEF DESCRIPTION OF THE DRAWING

The advantages and features of the disclosed invention will readily be appreciated by persons skilled in the art from the following detailed description when read in conjunction with the drawing wherein.

DETAILED DESCRIPTION OF THE DISCLOSURE

Figure 1:
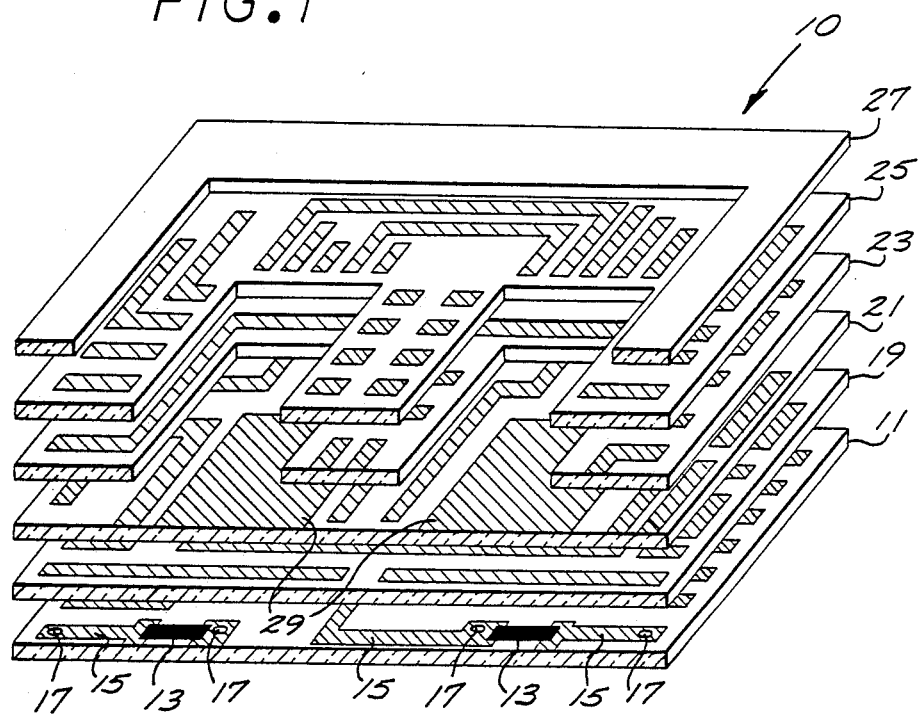
FIG. 1 schematically illustrates a hybrid multilayer circuit structure having buried trim resistors which may be trimmed in accordance with the invention.

In the following detailed description and in the several figures of the drawing, like elements are identified with like reference numerals.

Referring now to FIG. 1, illustrated therein is an exploded schematic view of the layers of a hybrid multilayer circuit structure 10. By way of example, the multilayer circuit structure 10 may be provided pursuant to known dielectric tape technology. The multilayer circuit structure 10 includes a bottom dielectric layer 11 on which a plurality of resistors 13 are formed. As discussed further herein, another dielectric layer 19 is laminated on top of the bottom dielectric layer 11, thereby covering the resistors 13 as well as other passive circuit elements formed on the bottom dielectric layer. The resistors 13 are therefore referred to as buried resistors. Although not specifically shown, buried capacitors may also be formed between the dielectric layers 11, 19.

Conductor runs 15 provide terminations for the buried resistors 13, and provide conductive access to the resistors 13. The conductor runs 15 are further conductively coupled to via metallizations 17 which pass through vias to the bottom of the bottom layer 11. The via metallizations 17 allow for the testing of the values of the buried resistors 13 for trimming purposes. Although not shown, conductor runs may be formed on the bottom of the the bottom dielectric layer 11 to provide for convenient conductive access to the via metallizations 17.

By way of example, the buried resistors 13 may be fabricated using standard thick film techniques, or with other techniques by which such burid resistors may be formed (e.g., thin film techniques). By way of specific example, the metallization for the conductor runs 15 may be screen printed on the top surface of the dielectric layer 11, and the resistors 13 may be screen printed on the bottom surface of the dielectric layer 19. This would avoid printing over paste which had only been dried, and moreover avoids having to print on possibly uneven screen printed thickness. It further avoids the possible reaction of the second paste with the first paste while the second paste is drying.

As a specific example, the dielectric layer 11 may be formed of commercially available ceramic tape marketed by the E. I. Du Pont De Nemours Company of Wilmington, Del. ("Du Pont") with the designation of #851AT. The resistors 13 may be formed with Series 1900 resistor material also available from Du Pont. The conductors 15 may be made of a thick film paste available from Du Pont and designated as 5717D; and the via metallizations may be made of thick film paste available from Du Pont and designated as 5718D. All of the foregoing materials may be utilized with a low temperature cofired process which utilizes a firing temperature of about 850° C.

The hybrid multilayer circuit structure 10 further includes internal dielectric layers 19, 21, 23 which may be made of the same ceramic tape as the bottom dielectric layer 11. The internal dielectric layers 19, 21, 23 include predetermined conductor runs, via metallizations, and buried circuit elements. The internal dielectric layer 21 is shown as including die bond pads 29, while the internal dielectric layer 23 is shown as including die cutouts. A wire bond dielectric layer 25 including conductor traces and via metallizations is disposed on top of the internal dielectric layer 23, and also includes die cutouts in alignment with those of the internal dielectric layer 23. The die cutouts provide cavities for devices (not shown) that are to be bonded to the die bond pads 29. Such devices are connected to conductor traces on the wire bond dielectric layer 25 by wire bonding.

A package seal layer 27, which may be of glass or a conductive material, surrounds the outer perimeter of the multilayer circuit structure 10, and is intended to accept a cover for hermetically sealing the package after discrete circuit devices (not shown) are bonded and wired to the multilayer circuit structure 10. In practice, further package seal layers may be utilized to build an enclosing cavity.

It should be understood that the foregoing multilayer circuit structure 10 is only schematically illustrated and described, and actual implementations may include different layers and configurations. For example, the internal dielectric layers and the wire bond layer may be without die cutouts, and the die bond pads would be included on the wire bond layer.

After the hybrid multilayer circuit structure 10 is appropriately fabricated with known techniques such as one of the ceramic tape technologies, discrete circuit devices (not shown) are bonded and wired to the multilayer circuit structure 10, and the resulting structure is hermetically sealed. The sealed package is then ready for resistor trimming.

Figure 2:
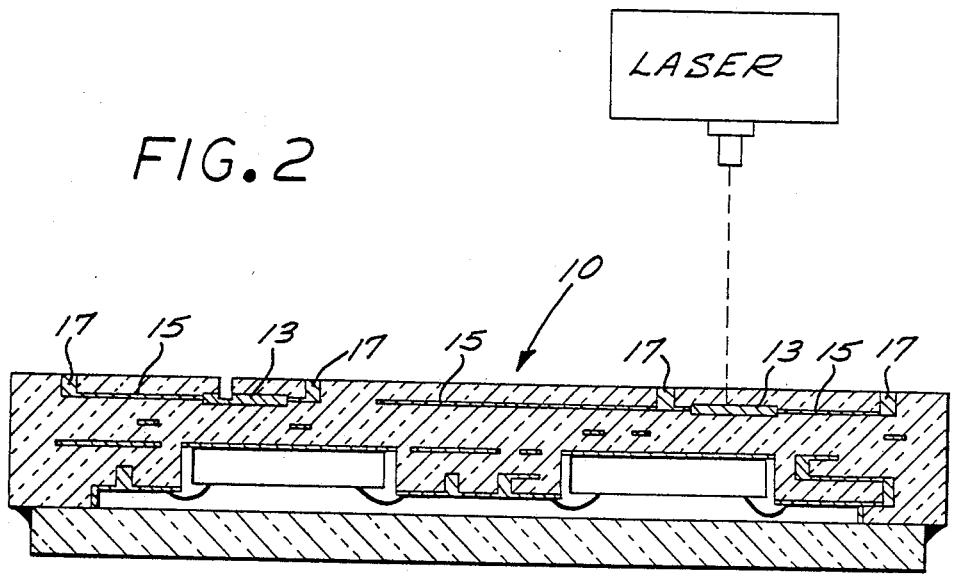
FIG. 2 schematically illustrates trimming of a buried thick film resistor in accordance with the invention.

Referring now to FIG. 2, the buried resistors 13 in the hermetically sealed multilayer circuit structure 10 are trimmed with known laser trimming equipment. The outlines of the resistors 13 are visible through the bottom of the bottom layer 11 and are aligned with the laser trimming equipment. The laser has to cut through the bottom dielectric layer 11 as well as through the resistor material, and several passes of the laser may be required. The values of the resistors 13, which increase pursuant to trimming, are measured by use of the via metallizations 17. After the resistors 13 are trimmed, the laser cut openings in the bottom dielectric layer 11 may be sealed, for example with a sealing glass that does not cause the resistor material to drift.

By way of example, an Electro Scientific Industries, Inc., Model 44 laser trimmer may be used with the following trim parameters: L-cut trimming mode, 13.5 Amps, 5000 Hz laser pulse rate, 0.5 mm/sec speed, and −15% cutoff. The −15% cutoff indicates that trimming is terminated when the value of the resistor being trimmed reaches a value of 15% less than the desired value.

The foregoing technique of trimming buried resistors is further utilized with buried capacitors, which are fabricated with known processes. Generally, a buried capacitor includes two conductive plates separated by a dielectric. For example, one conductive plate may be a conductive area screen printed on the top surface of a lower dielectric layer, and the dielectric may be a dielectric region screen printed over the screen printed conductive area. The other conductive plate may be a conductive area screen printed on the bottom surface of a dielectric layer that overlies the lower dielectric layer in registration with the conductive area and dielectric region screen printed on the lower dielectric layer. Alternatively, the dielectric region may comprise dielectric tape.

A buried capacitor is trimmed by selectively removing part of one or both of the capacitor plates after the hybrid circuit containing the buried capacitor has been fored and sealed. Trimming a buried capacitor in such manner reduces its capacitance.

While the foregoing has been generally directed to a hybrid package, it should be appreciated that the invention is applicable to other hybrid multilayer circuit structures.

It should also be understood that the invention is not limited to buried trim resistors and capacitors formed on the bottom dielectric layer of a laminated ceramic tape structure. For example, buried trim resistors or capacitors may be formed on the internal dielectric layer immediately beneath the wire bond layer 25. The trim areas of such buried resistors or capacitors would be located so that laser cutting through the wire bond dielectric layer 25 would not destroy or damage any conductor runs, via metallizations or passive circuit components (e.g., resistors) formed on the wore bond dielectric layer. Buried resistors or capacitors formed adjacent to the wire bond layer 25 would be particularly advantageous for hybrid multilayer circuit structures fabricated with standard thick film techniques which utilize an insulating substrate.

It should further be understood that the invention is applicable to any buried resistors or capacitors which have trim areas that are accessible by laser cutting that does not damage or destroy conductive or circuit structures formed on dielectric layers that are affected by the laser cutting. In other words, the trim areas of the buried resistors or capacitors have to be appropriately located.

While the foregoing has been directed to trimming buried resistors and capacitors with a laser, the invention contemplates the use of other techniques for selectively removing resistor and capacitor material, including abrasive, air jet, or waterjet trimming. Also, the invention contemplates trimming other passive circuit components that may be buried in a hybrid multilayer circuit structure.

The foregoing described invention provides several advantages including the following. It provides for trim resistors and capacitors which do not utilize valuable top layer area, thereby allowing for denser discrete device packing. The invention further provides for trim resistors and capacitors which do not require extra processing steps for passivation. Also, the invention provides for trim resistors an capacitors which may be fabricated with known hybrid techniques.

Although the foregoing has been a description and illustration of specific embodiments of the invention, various modifications and changes thereto can be made by persons skilled in the art without departing from the scope and spirit of the invention as defined by the following claims.

What is claimed is:

1. A process for trimming a passive circuit component formed within a hybrid multilayer circuit structure, comprising the steps of:
    forming a buried passive circuit component between two dielectric layers of hybrid multilayer circuit structure;
    processing the multilayer circuit structure to provide a fired structure having a buried passive circuit component disposed between two fired dielectric layers thereof; and
    selectively trimming the buried passive circuit component through at least one fired dielectric layer.

2. The process of claim 1 wherein the step of trimming the buried passive circuit component includes the step of selectively removing part of the material of the buried passive circuit component from an electrical circuit to which said component is interconnected.

3. The process of claim 2 wherein the step of selectively removing part of the material of the buried passive circuit component includes the step of selectively removing part of the material of the buried passive circuit component with a laser beam.

4. The process of claim 3 further including the step of sealing openings in the multilayer circuit structure made by the selective removal of part of the material of the buried passive circuit component.

5. The process of claim 1 wherein the step of forming a buried passive circuit component includes the step of forming a buried resistor.

6. The process of claim 5 wherein the step of forming a buried resistor includes the step of forming a thick film resistor.

7. The process of claim 1 wherein the step of forming a buried passive circuit component includes the step of forming a buried capacitor.

8. A process of making a hybrid multilayer circuit structure haing a buried passive circuit component disposed therein, said method comprising the steps of:
    (1) providing a substrate;
    (2) sequentially laminating a plurality of dielectric layers on top of said substrate, selected ones of said layers having conductor patterns disposed thereon;
    (3) disposing a passive circuit component between selected ones of the laminated dielectric layers during the preceding lamination sequence;
    (4) sequentially firing the laminated dielectric and conductor layers;
    steps (2), (3) and (4) providing a fired hybrid multilayer circuit structure having a buried passive circuit component disposed between two layers thereof; and
    (5) selectively trimming the buried passive circuit component through at least one dielecrtric layer.

9. The process of making a hybrid multilayer circuit structure of claim 8 wherein said laminating step (2) further comprises the step of:
    sequentially printing a plurality of conductor layers onto said plurality of laminated dielectric layers.

10. A process of making a hybrid multilayer circuit structure having a buried passive circuit component disposed therein, said method comprising the steps of:
    (1) providing a substrate;
    (2) sequentially printing a plurality of dielectric layers on top of said substrate, selected ones of said layers having conductor patterns disposed thereon;
    (3) disposing a passive circuit component between selected ones of the printed dielectric layers during the preceding printing sequence;
    (4) sequentially firing the printed dielectric and conductor layers;
    steps (2), (3) and (4) providing a fired hybrid multilayer circuit structure having a buried passive circuit component disposed between two layers thereof; and
    (5) selectively trimming the buried passive circuit component through at least one dielectric layer.

11. a process of making a hybrid multilayer circuit structure having a buried passive circuit component disposed therein, said method comprising the steps of:
    (1) providing a substrate;
    (2) laminating a plurality of dielectric layers on top of said substrate, selected ones of said layers having conductor patterns disposed thereon;
    (3) disposing a passive circuit component between selected ones of the dielectric layers during the preceding laminating sequence;
    (4) simultaneously firing the laminated dielectric and conductor layers;
    steps (2), (3) and (4) providing a fired hybrid multilayer circuit structure having a buried passive circuit component disposed between two layers thereof; and
    (5) selectively trimming the buried passive circuit component through at least one dielectric layer.

* * * * *